US012676187B2

(12) United States Patent
Barve et al.

(10) Patent No.: US 12,676,187 B2
(45) Date of Patent: Jul. 7, 2026

(54) FERROELECTRIC FIELD EFFECT TRANSISTORS BASED APPROACH FOR EUCLIDEAN DISTANCE CALCULATION IN NEUROMORPHIC HARDWARE

(71) Applicant: University of Cincinnati, Cincinnati, OH (US)

(72) Inventors: Siddharth Barve, Mason, OH (US); Rashmi Jha, Wyoming, OH (US)

(73) Assignee: University of Cincinnati, Cincinnati, OH (US)

( * ) Notice: Subject to any disclaimer, the term of this patent is extended or adjusted under 35 U.S.C. 154(b) by 176 days.

(21) Appl. No.: 18/534,269

(22) Filed: Dec. 8, 2023

(65) Prior Publication Data

US 2024/0194237 A1 Jun. 13, 2024

Related U.S. Application Data

(60) Provisional application No. 63/431,219, filed on Dec. 8, 2022.

(51) Int. Cl.
*G11C 11/54* (2006.01)
*G06N 3/063* (2023.01)
(Continued)

(52) U.S. Cl.
CPC .............. *G11C 11/54* (2013.01); *G06N 3/063* (2013.01); *G06N 3/08* (2013.01); *G11C 11/223* (2013.01); *G11C 11/2275* (2013.01)

(58) Field of Classification Search
CPC ... G11C 11/223; G11C 11/2275; G11C 11/54; G06N 3/063; G06N 3/08; G06N 3/065; H10B 51/30; H10D 30/701
See application file for complete search history.

(56) References Cited

U.S. PATENT DOCUMENTS 3,845,471 A * 10/1974 Reitbeock ............ G06V 30/194
365/49.17
4,999,525 A * 3/1991 Park ........................ G06N 3/063
708/801
(Continued)

FOREIGN PATENT DOCUMENTS

CN 107533860 A 1/2018
JP H10503608 A * 3/1998 ............... G06G 7/20
WO 2014186529 A1 11/2014

OTHER PUBLICATIONS

Aziz, et al., "Computing with Ferroelectric FETs: Devices, Models, Systems, and Applications", Design, Automation & Test in Europe Conference & Exhibition, pp. 1-11, 2018.
(Continued)

*Primary Examiner* — Jay W. Radke
(74) *Attorney, Agent, or Firm* — DINSMORE & SHOHL LLP

(57) ABSTRACT

An apparatus may comprise a synapse comprising a first reconfigurable field-effect transistor; a second reconfigurable field-effect transistor connected in parallel to the first reconfigurable field-effect transistor; an input voltage applied to each of the first reconfigurable field-effect transistor and the second reconfigurable field-effect transistor corresponding to an input attribute associated with an error computation; and a current sensor measures a saturation drain current of the first reconfigurable field-effect transistor and the second reconfigurable field-effect transistor and determines a Euclidean error based on the saturation drain current of the FETs.

20 Claims, 16 Drawing Sheets

200

$I_{DS} \alpha (V_X - V_W)^2$

300

$I_{DS} \alpha (V_X - V_W)^2$

(51) Int. Cl.
    *G06N 3/08*         (2023.01)
    *G11C 11/22*       (2006.01)

(56)          References Cited

U.S. PATENT DOCUMENTS

| | | |
|---|---|---|
| 8,089,108 B2 | 1/2012 | Wilson et al. |
| 9,818,848 B2 | 11/2017 | Sun et al. |
| 10,719,296 B2 | 7/2020 | Lee et al. |
| 10,892,330 B2 | 1/2021 | Han et al. |
| 2023/0071750 A1* | 3/2023 | Chang ................... H10B 53/30 |

OTHER PUBLICATIONS

Barve, et al., "NeuroSOFM: A Neuromorphic Self-Organizing Feature Map Heterogeneously Integrating RRAM and FeFET", Journal on Exploratory Solid-State, vol. 7, No. 2, pp. 97-105, Dec. 2021.
Covi, et al., "Ferroelectic-based synapses and neurons for neuromorphic computing", Neuromorphic Computer Eng., vol. 2, pp. 1-13, 2022.
Talaska, et al., "Current Mode Euclidean Distance Calculation Circuit for Kohonen's Neural Network Implemented in CMOS 0.18μm Technology", University of Florida, pp. 437-440, 2024.
Mulaosmanovic, et al., "Novel ferroelectric FET based synapse for neuromorphic systems", University of Florida, pages T176-T177, 2024.

* cited by examiner

400

420 Inputs

| FeFET Error Synapse 402 | FeFET Error Synapse 408 | FeFET Error Synapse 414 |
| FeFET Error Synapse 404 | FeFET Error Synapse 410 | FeFET Error Synapse 416 |
| FeFET Error Synapse 406 | FeFET Error Synapse 412 | FeFET Error Synapse 418 |

BMU Selection 422

BMI Neuron Labeling 424

Training

Classification

FERROELECTRIC FIELD EFFECT TRANSISTORS BASED APPROACH FOR EUCLIDEAN DISTANCE CALCULATION IN NEUROMORPHIC HARDWARE

CROSS-REFERENCE TO RELATED APPLICATION

This application claims priority to U.S. Provisional Application No. 63/431,219 filed on Dec. 8, 2022, which is incorporated herein by reference in its entirety.

FEDERALLY SPONSORED RESEARCH STATEMENT

The present invention was made with Government support under Contract Nos. CCF-1718428 and ECCS-1926465 awarded by the National Science Foundation. The Government has certain rights in the invention.

TECHNICAL FIELD

The present specification relates to hardware acceleration circuits, and more particularly, to a reconfigurable threshold voltage field effect transistors-based approach for Euclidean distance calculation in neuromorphic hardware.

BACKGROUND

Machine learning algorithms are often trained by receiving a large amount of training data, and iteratively updating weights associated with a plurality of nodes. Updating the weights typically requires performing one or more mathematical computations associated with each node. Modern machine learning algorithms may utilize a large amount of nodes. For example, deep neural networks may utilize many layers, with each layer containing thousands or even millions of nodes.

As such, each time that the weights of the neural network are updated, millions of weight values associated with the nodes must be retrieved from memory, millions of computations must be performed, and the updated weights must be stored back in the memory. In addition to requiring a large amount of computing resources, the time required to read and write to the memory during each iteration of updating the nodes may cause the training process to be very slow. Accordingly, a need exists for hardware acceleration for Euclidean distance computations and training such neural networks.

SUMMARY

In an embodiment, an apparatus may include a synapse comprising a first reconfigurable field-effect transistor comprising an n-channel or p-channel ferroelectric field-effect transistor with a gate voltage being an input voltage or a weight voltage and a threshold voltage based on a weight voltage; and a second reconfigurable field-effect transistor connected in parallel to the first reconfigurable field-effect transistor and comprising an n-channel or p-channel ferroelectric field-effect transistor with a gate voltage being the weight voltage or the input voltage and a threshold voltage based on the input voltage, wherein the input voltage is applied to a gate of the first reconfigurable field-effect transistor and/or the second reconfigurable field-effect transistor, the input voltage corresponding to an input attribute associated with an error computation; and a current sensor measuring a saturation drain current of the first reconfigurable field-effect transistor or the second reconfigurable field-effect transistor, and determining a Euclidean error based on the saturation drain current of the first reconfigurable field-effect transistor or the second reconfigurable field-effect transistor.

In another embodiment, a method may include receiving an input voltage corresponding to an input attribute of a self-organizing feature map; applying the input voltage to each synapse of a two-dimensional grid of synapses, each synapse corresponding to a neuron of the self-organizing feature map, and comprising two reconfigurable field-effect transistors, wherein a weight associated with the neuron is stored as a threshold voltage of at least one of the reconfigurable field-effect transistors; determining a best matching neuron based on a saturation drain current of one of the reconfigurable field-effect transistors of each synapse; and updating the threshold voltages of at least one of the reconfigurable field-effect transistors of at least one synapse of the two-dimensional grid of synapses based on the best matching neuron.

BRIEF DESCRIPTION OF THE DRAWINGS

The embodiments set forth in the drawings are illustrative and exemplary in nature and not intended to limit the disclosure. The following detailed description of the illustrative embodiments can be understood when read in conjunction with the following drawings, where like structure is indicated with like reference numerals and in which.

DETAILED DESCRIPTION

One type of machine learning algorithm that utilizes neural networks is a Self-Organizing Feature Map (SOFM). An SOFM is an unsupervised machine learning algorithm used to produce a low-dimensional (typically 2-D) representation of a higher dimensional data set while preserving the topological structure of the data. For example, a data set with p variables measured in n observations may be represented as clusters of observations with similar values for the variables. These clusters may be visualized as a 2-D map such that observations in proximal clusters have more similar values than observations in distal clusters. This can allow for high-dimensional data to be easily visualized and analyzed.

Figure 1:
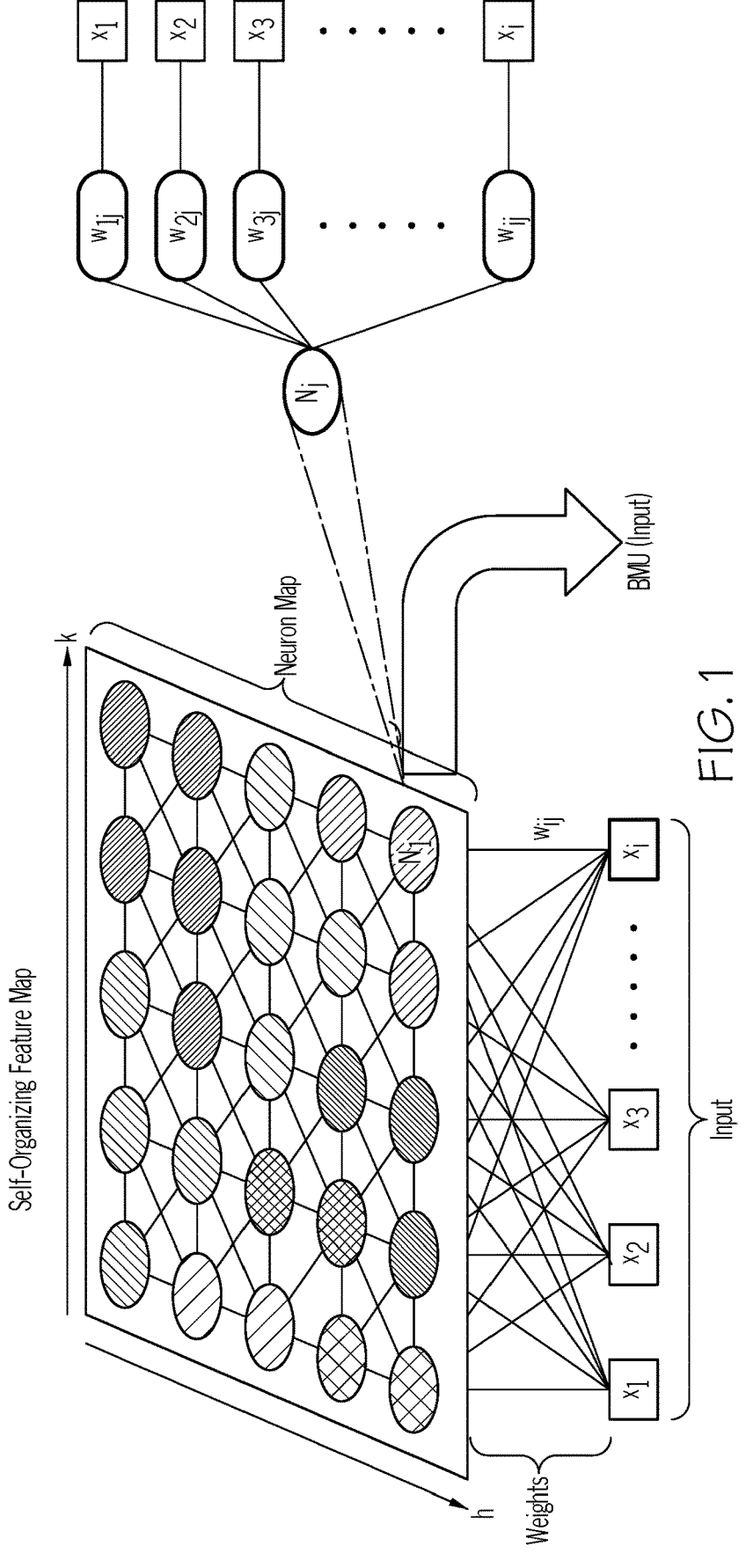
FIG. 1 depicts an example architecture of a self-organizing feature, according to one or more embodiments shown and described herein.

An SOFM comprises a single layer of interconnected neurons. Each neuron in the network contains a weight vector of the same dimension as the input space, with each weight corresponding to an input attribute. FIG. 1 illustrates an example architecture of an SOFM. The neuron map topology (e.g., hexagonal, rectangular, etc.) is governed by the configuration of the connections between the neurons. The SOFM then reflects the topology of the dataset on the topology of the neuron map via competitive learning. By reflecting the topology of complex datasets onto the 2-D neuron map, the SOFM projects higher dimensional input spaces onto a lower dimensional neuron space. In this sense, the SOFM performs a function similar to principal component analysis (PCA). Additionally, since the topology of the original data is preserved, clusters begin to form on the neuron map. In this sense, the SOFM performs a function similar to K-means clustering, without any user defined k-cluster parameter.

To project the input data onto the neuron map, each neuron must learn and be representative of an input datapoint or set of input data. First, each neuron in the map computes a Euclidean error or Euclidean distance between each attribute in the input and the corresponding weight. The Euclidean distance may be calculated using the following equation:

$$\in = (x_i - w_{ij})$$

where $x_i$ is the input attribute and $w_{ij}$ is the corresponding weight on neuron j. These input-weight errors are then accumulated to compute a total error between the observed input and each neuron in the map.

The neuron with the least total Euclidean error or highest similarity is then selected as the representative neuron or Best Matching Unit (BMU). The BMU is selected as the cluster center for that input and pulls weights of the neurons in its neighborhood closer. This is done by updating every neuron's weight vector in the direction of the input vector in relation to the neuron's distance from the BMU of the input, as shown in the equation below.

$$\Delta w_{ij} = \eta \wedge_j (j, j_{BMU})(x_i - w_{ij})$$

Additionally, this weight update is scaled by the input-weight error for each weight and a global learning rate shown in the equation below.

$$\wedge_j = e^{\frac{-(d_2(j, \, j_{BMU}))^2}{2\sigma^2}}$$

where $\wedge(j), j_{BMU}$ is the neighborhood function output for neuron j with respect to BMU $j_{BMU}$.

The neighborhood of the BMU is often modeled as a Gaussian distribution centered at the BMU and in respect to the Euclidean distance between the BMU and the neuron as shown in the above equation, where $d_2$ is the Euclidean distance between neuron j and the BMU, and $\sigma$ is the neighborhood rate. The neighborhood rate and the learning rate experience exponential decay over time by a decay time constant allowing the SOFM to converge. By clustering neurons in the neighborhood of the BMU for each input, the topography of the data is maintained since neurons in proximity in the input space will appear in proximity in the neuron space.

As discussed above, the key to updating the weights while training an SOFM is determining the Euclidian distance between an input attribute and a current weight of a neuron, defined as $\in = (x_g - w_{ij})^2$. While this can be computed using conventional computing methods, for a large SOFM with millions of nodes, this would require retrieving millions of weights from memory, performing the required calculations to determine the update weight for each node, and then storing the updated weights in memory. The amount of time required to read and write so much data to the memory during each iteration of updating the weights would cause the SOFM to train very slowly.

As such, in embodiments disclosed herein, rather than storing the weights associated with each node in a memory, each node is represented by a pair of field-effect transistors (FETs), as disclosed herein. The saturation drain current (Ips) of a long-channel FET is given by:

$$I_{DS} = \frac{\mu W C'_{ox}}{2L} (V_{GS} - V_T)^2,$$

where W is the width, L is the length, Cox is the oxide capacitance per unit area, u is the effective mobility carrier, $V_{GS}$ is the gate voltage, and $V_T$ is the threshold voltage. The values of W, L, Cox, and $\mu$ are constant once a FET is manufactured. As such, $I_{DS}$ is proportional to $(V_{GS} - V_T)^2$, which is the Euclidean error between the gate voltage $V_{GS}$ and the threshold voltage $V_T$.

Accordingly, in embodiments disclosed herein, FETs are used to represent nodes of an SOFM, with the input attribute $x_i$ of the SOFM corresponding to the gate voltage Ves of at least one of the FETs, and the weight of a neuron of the SOFM corresponding to the threshold voltage $V_T$ of at least one of the FETs. Then, measuring a saturation drain current tIDS of one of the FETs that indicates the Euclidean error between the gate voltage $V_{GS}$ of the FET and the threshold voltage $V_T$ of the FET, which corresponds to the Euclidian error between the input attribute and the neuron weight of the SOFM. As such, during training of the SOFM, the weights can be updated by modifying threshold voltages of the nodes of the SOFM without needing to access a memory. This may allow for the SOFM to be trained significantly faster than training the SOFM using traditional computing techniques.

Figure 2:
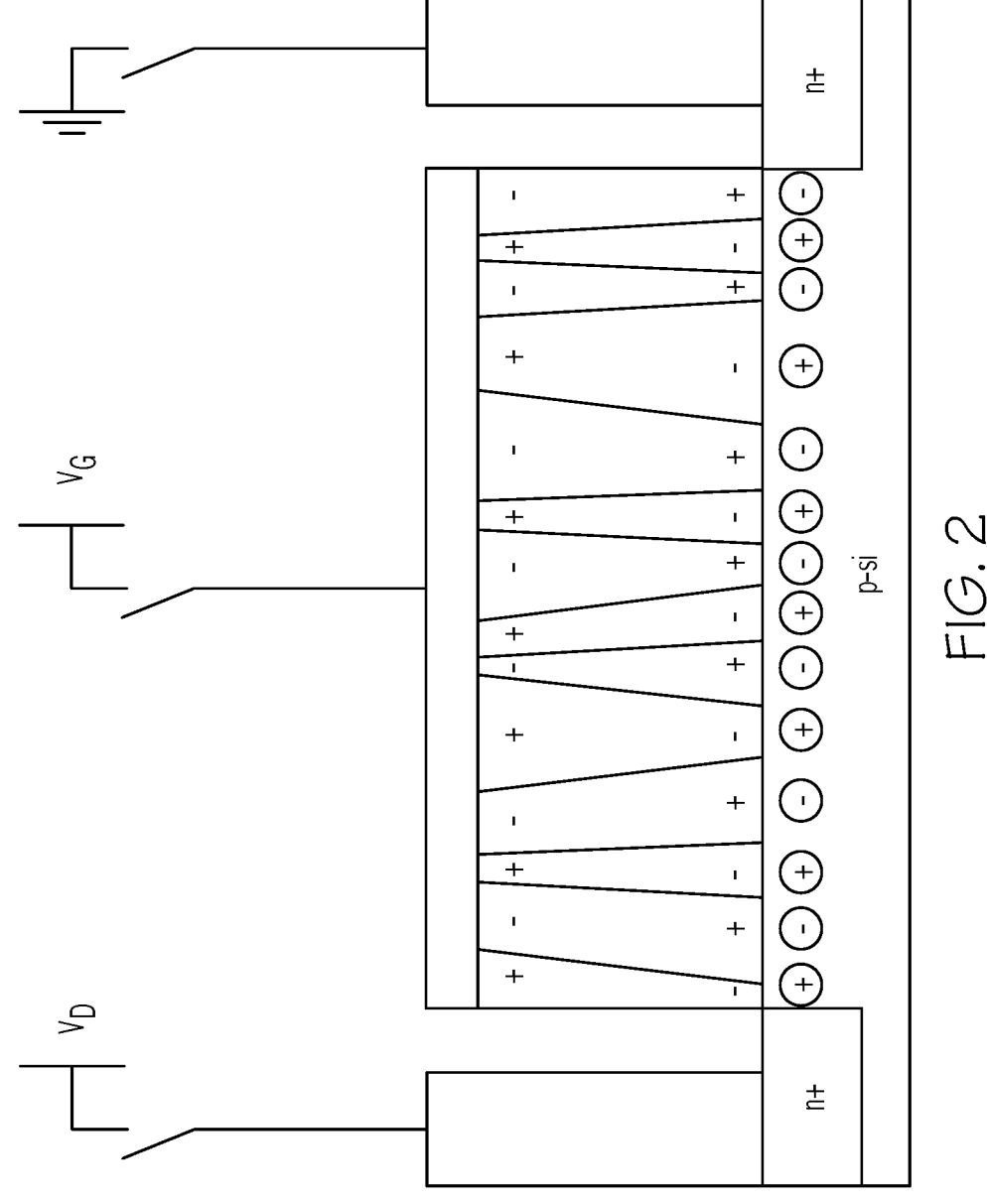
FIG. 2 depicts an example architecture of a ferroelectric field-effect transistor.

In traditional FETs, the threshold voltage $V_T$ is fixed by doping when a FET is manufactured. However, certain FETs are reconfigurable such that the threshold voltage $V_T$ can be set by applying a bias. In particular, ferroelectric field-effect transistors (FeFETs) are a modification of a metal-oxide field-effect transistor (MOSFET) device with a ferroelectric material integrated in the gate stack. An example FeFET 100 is shown in FIG. 2.

Ferroelectric materials are a subset of dielectric materials that exhibit a permanent induced polarization in the presence of a sufficient externally applied electric field. This polarization arises due to polarization of re-orientable unit cells which organize into polarized ferroelectric domains resulting in a net polarization across the material. By integrating a multi-domain ferroelectric material on the gate stack, the effective threshold voltage $V_T$ of the FET can be modulated by polarizing the ferroelectric material. As such, the ability to induce a permanent polarization of the ferroelectric material results in a FeFET with a reprogrammable threshold voltage $V_T$.

Because FeFETS have a reprogrammable threshold voltage $V_T$ they can be used to represent nodes of an SOFM. When the weight of a node is to be updated, a_saturation drain current $I_{DS}$ of a FeFET can be measured to determine the Euclidian distance needed to determine the updated weight, and the threshold voltage $V_T$ of at least one FET in a node of the SOFM can be reprogrammed by applying a bias voltage to effectively store the new weight as the reprogrammed threshold voltage $V_T$. While embodiments disclosed herein utilize FeFETS as nodes of an SOFM, it should be understood that in other examples, other types of reconfigurable FETs may be used instead.

While the saturation drain current $I_{DS}$ of a FeFET is proportional to the Euclidian distance between the gate voltage $V_{DS}$ and threshold voltage $V_T$, this requires that the FeFET be conducting. Therefore, an n-channel FeFET only indicates the Euclidean error when $V_{GS} \geq V_T$. Accordingly, in embodiments disclosed herein, a dual n-channel FeFET synapse is utilized where each node of an SOFM is represented by a pair of FeFETS. One FeFET computes the Euclidean error when $V_{GS} \geq V_T$ and the other FeFET computes the Euclidean error when $V_{GS} < V_T$.

Figure 3A:
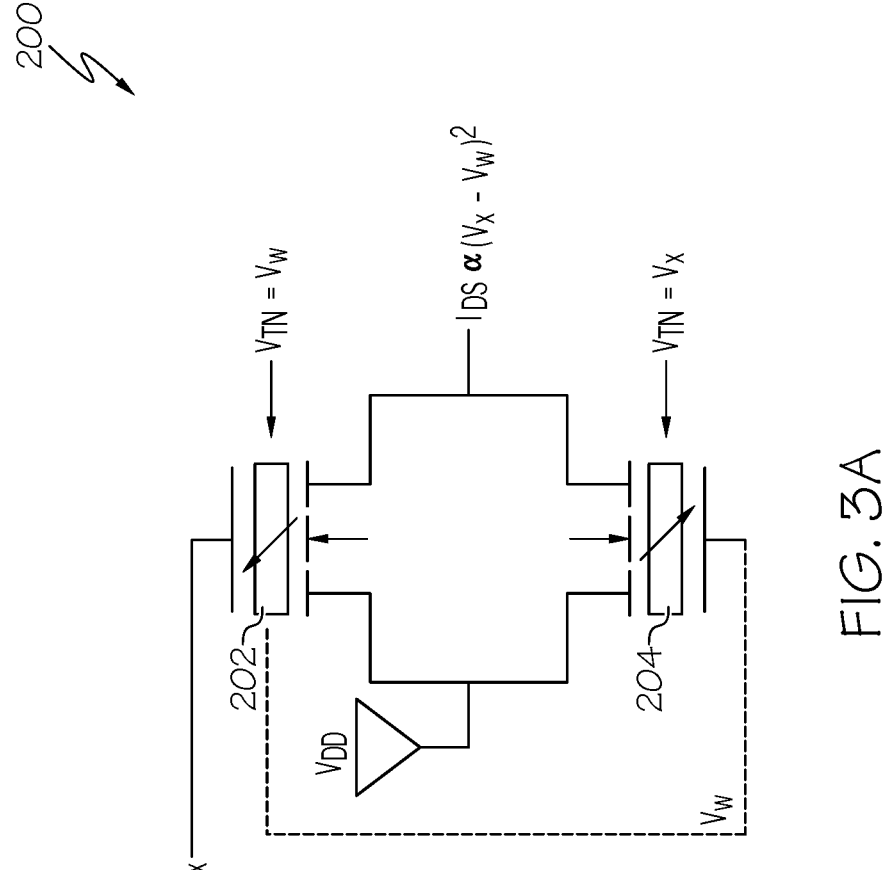
FIG. 3A depicts an example FeFET transmission gate synapse, according to one or more embodiments shown and described herein.

Turning now to FIG. 3A, an example FeFET transmission gate synapse 200 for Euclidean input-weight error calculation. The synapse 200 may be used to represent a node of an SOFM neural network, as disclosed herein. In the example of FIG. 3, the synapse 200 includes a first n-channel FeFET 202 and a second n-channel FeFET 204.

As shown in FIG. 3A, the voltage $V_X$, which corresponds to the input attribute, is applied to the gate of the first n-channel FeFET 202, and as the threshold voltage $V_{TN}$ of the second n-channel FeFET 204. In addition, the voltage $V_W$, which corresponds to the weight of the node for the synapse 200, is programmed as the threshold voltage $V_{TN}$ of the first n-channel FeFET 202, and applied to the gate of the second n-channel FeFET 204. As such, the saturation drain current $I_{DS}$ is proportional to the Euclidean error between the input attribute $V_X$ and the weight $V_W$.

When the gate voltage $V_X$ is greater than or equal to the threshold voltage $V_W$, current flows through the first n-channel FeFET 202, and when the gate voltage $V_X$ is less than the threshold voltage $V_W$, the current flows through the second n-channel FeFET 204. Accordingly, a drain current measures the Euclidean error in either situation. Therefore, by applying the voltages as discussed above and measuring a saturation drain current of one of the FeFETs 202, 204, the Euclidean distance needed to determine the updated weight values of nodes may be determined. The updated weight value for the node may be computed, and the updated weight value may be stored in the synapse 200 by modifying the threshold voltages of the FeFETs 202, 204, as discussed in further detail below.

In some examples, the first n-channel FeFET 202 and the second n-channel FeFET 204 may be replaced by a first and second p-channel FeFET. In these examples, the first p-channel FeFET receives the weight voltage $V_W$ as its gate voltage and the input voltage minus a source voltage $V_X$-$V_{DD}$ as its threshold voltage. Furthermore, in these examples, the second p-channel FeFET receives the input voltage $V_X$ as its gate voltage and the weight voltage minus the source voltage $V_W$-$V_{DD}$ as its threshold voltage.

While the example synapse 200 of FIG. 3A effectively computes the Euclidean error, it requires measuring or programming $V_T$ for the first n-channel FeFET 202 and programming the second n-channel FeFET 204 to have $V_T = V_X$ for every Euclidean error computation. This introduces substantial power and time overhead as well as compounding errors due to non-idealities. Accordingly, in another example, the second n-channel FeFET may be replaced by a p-channel FeFET, as shown in FIG. 3B.

Figure 3B:
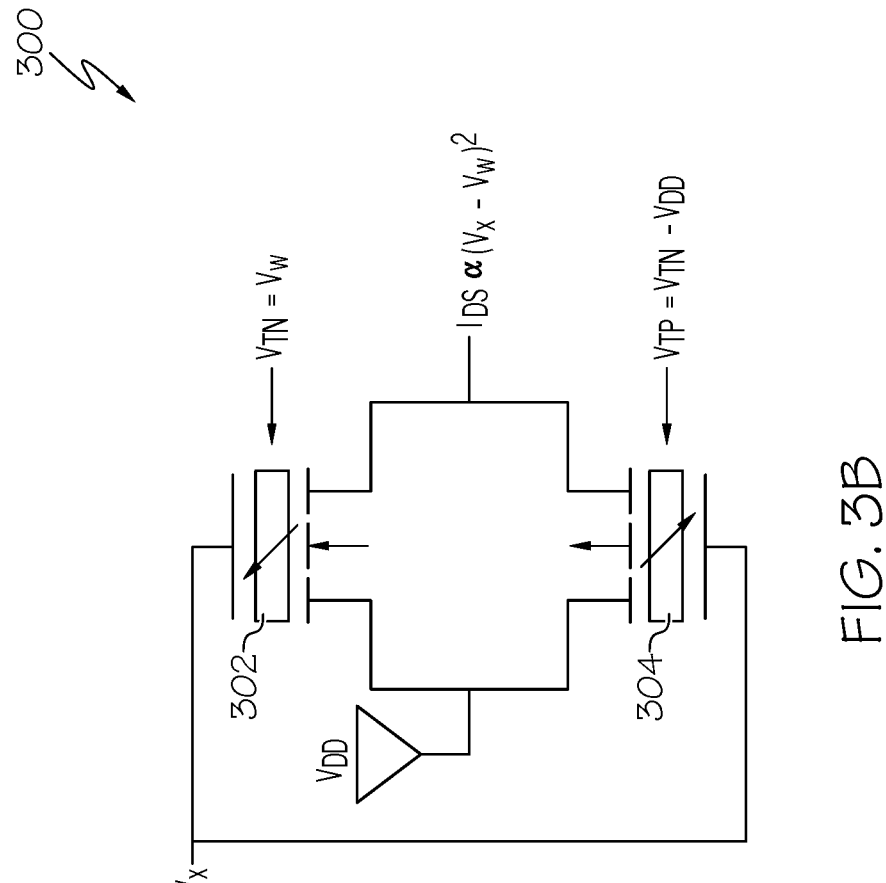
FIG. 3B depicts another example FeFET transmission gate synapse, according to one or more embodiments shown and described herein.

FIG. 3B shows an example FeFET transmission gate synapse 300 which includes an n-channel FeFET 302 and a p-channel FeFET 304. In the example of FIG. 3B, the threshold voltages of the p-channel FeFET ($V_{TP}$) and the n-channel FeFET ($V_{TN}$) are programmed such that such that $V_{TP} = V_{TN}$-$V_{DD}$. This results in the p-channel FeFET computing the Euclidean error when the weight exceeds the input, effectively replacing the second n-channel FeFET 204 of FIG. 3A. By applying the same weight update as the n-channel FeFET to the p-channel FeFET, the complementary relation between the threshold voltages of the devices is maintained. As such, both n-channel and p-channel FeFET devices may be used for their corresponding half of the Euclidean error computation without the overhead required with the use of two n-channel FeFETs. Accordingly, the saturation drain current is still proportional to the Euclidean error $(V_X - V_W)^2$.

In the examples of FIG. 3A and FIG. 3B, long-channel ferroelectric FETs are used, and [the] a saturation drain current of the FeFETs is proportional to $(V_X - V_W)^2$. However, in other examples, other types of FETs may be used for the synapses 200 or 300, which produce a saturation drain current that is proportional to $(V_X - V_W)^\alpha$, where a has a value ranging between about 1 and 2. In the illustrated example where Euclidean error is calculated, the value of $\alpha$ is 2. However, in other examples, short channel effects may reduce the value of a from 2 to a smaller value. In particular, the value of a may be affected by parameters of the FET such as channel length, oxide thickness, and the like. These parameters may be determined during the manufacturing process such that the value of a may be tuned as a hyperparameter.

In the illustrated example, when $\alpha$ has a value of 2, the synapses 200 and 300 compute Euclidian distance, which may be used to train an SOFM, as disclosed herein. However, in other examples, different values of $\alpha$ may be used to compute other distance metrics, which may be used to implement other data analytics techniques. In addition, an SOFM in which Euclidean error is calculated using a value for α of less than 2 may also be used, which may be preferable for certain applications.

Furthermore, Euclidean error may be used in other applications other than SOFMs. For example, many different machine learning or data analysis techniques utilize Euclidean error or similar error metrics. As such, the synapses 200 and 300 disclosed herein may be used in a variety of applications and the value of α may be tuned for different applications during the manufacturing process of the particular FETs to be used.

Figure 4:
FIG. 4 depicts a schematic diagram of an SOFM architecture, according to one or more embodiments shown and described herein.

Turning now to FIG. 4, an architecture for an example SOFM 400 is illustrated. In the example of FIG. 4, the SOFM 400 includes FeFET Error Synapses 402, 404, 406, 408, 410, 412, 414, 416, 418, which each represent a neuron of the SOFM 400. Each of these synapses may comprise the synapse 200 of FIG. 2 or the synapse 300 of FIG. 3. In the example of FIG. 4, the SOFM 400 comprises a grid of 3×3 synapses. However, it should be understood that in other examples, an SOFM architecture may comprise any number of synapses.

In the example of FIG. 4, the SOFM 400 utilizes a crossbar architecture. That is, inputs 420 are provided to each synapse. During training of the SOFM 400, the input 420 may comprise training data, and may comprise the voltage $V_X$ to be applied to the FeFETs 202, 204 of FIG. 2 or to the FeFETs 302, 304 of FIG. 3. As discussed above, the Euclidean error may be determined based on the saturation drain current output by each synapse. The current for each synapse may be accumulated in a capacitor associated with the synapse. As such, the charging rate for each such capacitor is proportional to the total error for the corresponding neuron.

The SOFM 400 also includes a BMU selection circuit 422 and a BMI neuron labeling circuit 424. The BMU selection circuit 422 may select a best matching unit (BMU), as disclosed herein. In particular, the BMU selection circuit may be implemented using a complementary metal-oxide-semiconductor (CMOS) logic circuit that identifies the neuron whose capacitor is last to charge to logic 1. The selection of the BMU is an important part in training the SOFM 400 as it identifies the location of weight update and thus clusters for competitive learning. In addition, after the SOFM 400 has been trained, it may be used to classify input data. In some examples, a Gaussian distribution is applied to offset each neuron's error, due to device and material variability, to produce an effective error.

Figure 5A:
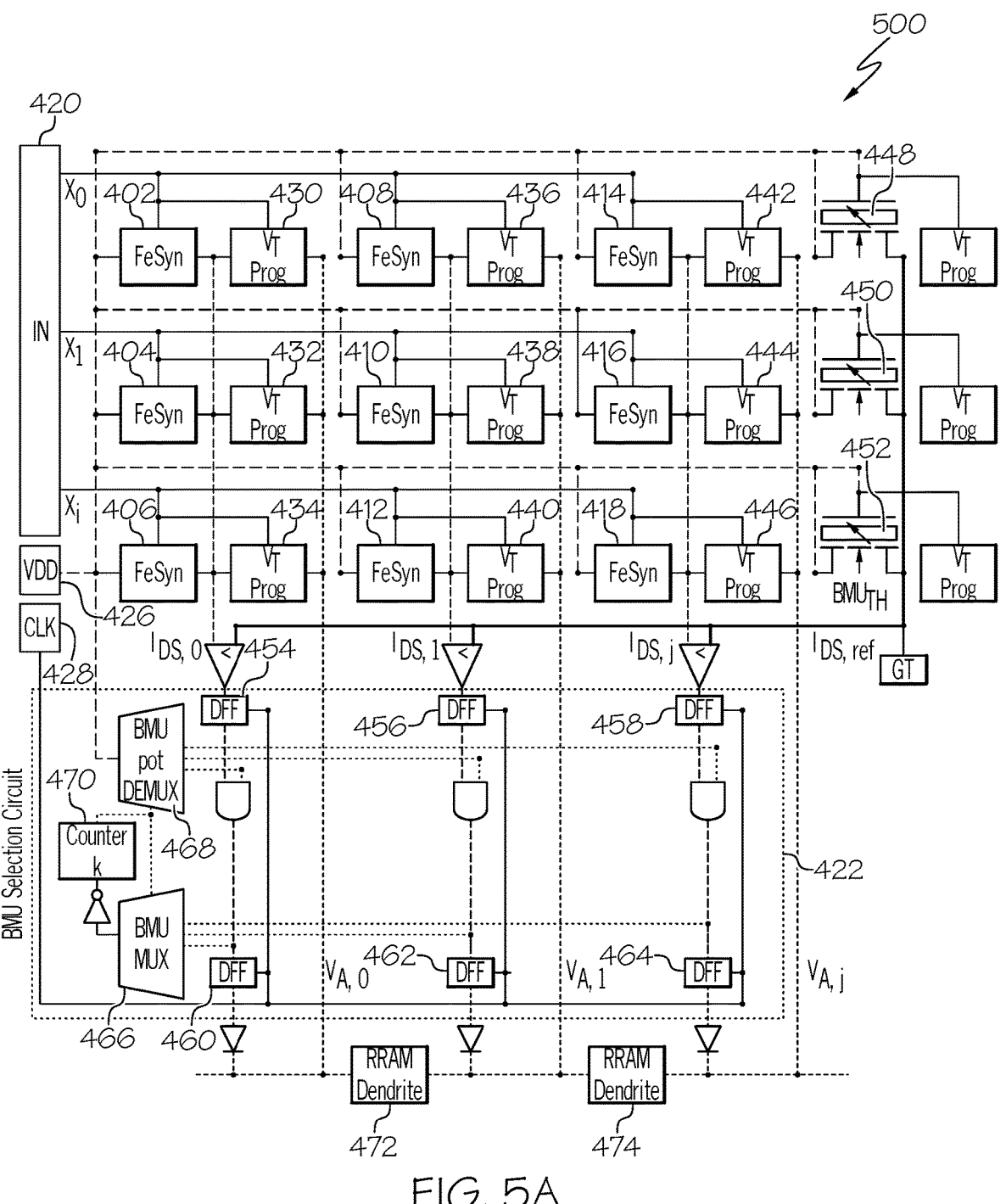
FIG. 5A depicts a schematic diagram of another SOFM architecture, according to one or more embodiments shown and described herein.

FIG. 5A shows another example architecture for an SOFM 500. The architecture of the SOFM 500 is similar to the architecture of the SOFM 400, however additional features are included. In particular, the SOFM 500 in the example of FIG. 5 illustrates an example circuit diagram for the BMU selection circuit 422. The SOFM 500 also illustrates the $V_{DD}$ input 426 provided to the FeFET synapses and a clock signal 428 that drives the BMU selection circuit 422.

The SOFM 500 of FIG. 5A also shows a plurality of threshold voltage programming circuits 430, 432, 434, 436, 438, 440, 442, 444, and 446. Each threshold voltage programming circuit sets the threshold voltages for the FeFETs of a corresponding synapse in order to update the weights stored therein, as described above. In particular, the threshold voltage programming circuits comprise pulse generation circuits that are modulated by the current produced by the synapse and an applied voltage (e.g., $V_{A,0}$, $V_{A,1}$, $V_{A,j}$ as shown in FIG. 5.

Figure 10:
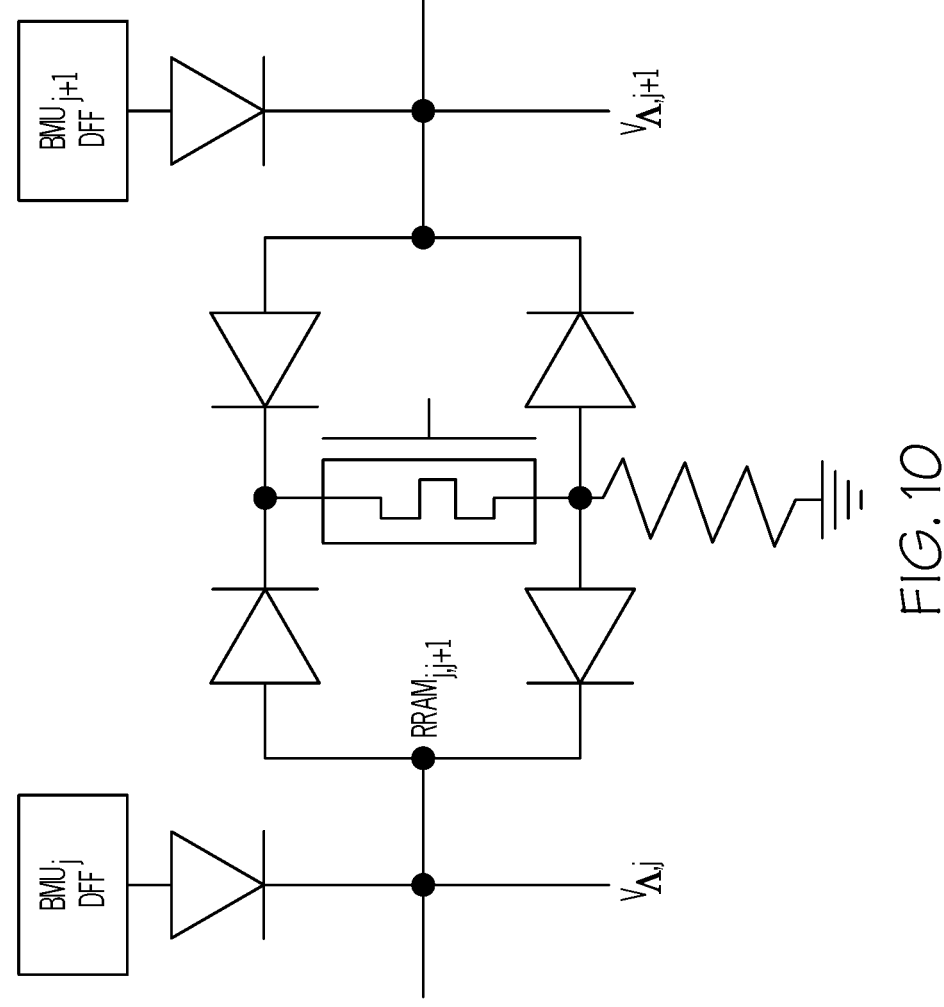
FIG. 10 schematically depicts an example reconfigurable interconnect in inter-neuro configuration, according to one or more embodiments shown and described herein.

The SOFM 500 of FIG. 5A also includes additional FeFETs 448, 450, 452, which are used by the BMU selection circuit 422 to evaluate neurons that qualify as BMUs. The FeFETS 448, 450, 452 receive an input $V_X=V_{DD}$. The SOFM 500 of FIG. 5 also includes a first set of D flip flops 454, 456, 458, a second set of D flip[flops 460, 462, 464, a multiplexer 466, a demultiplexer 468, and a counter 470, which are discussed in further detail below. The SOFM 500 of FIG. 5A also includes RRAM Dendrite circuits 472, 474 between the neurons off the SOFM 500, examples of which are illustrated in FIG. 10.

Figure 5B:
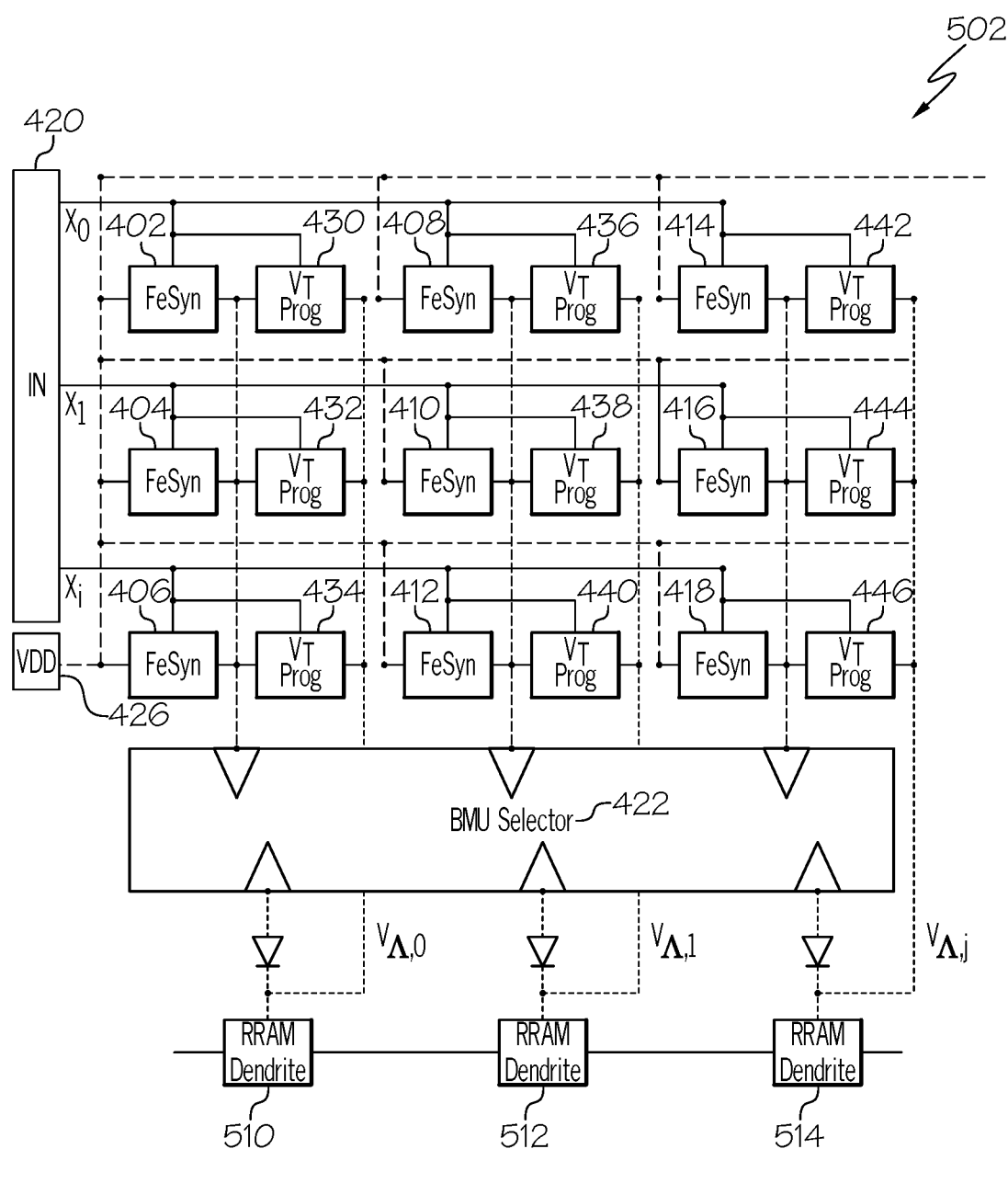
FIG. 5B depicts a schematic diagram of another SOFM architecture, according to one or more embodiments shown and described herein.
Figure 11:
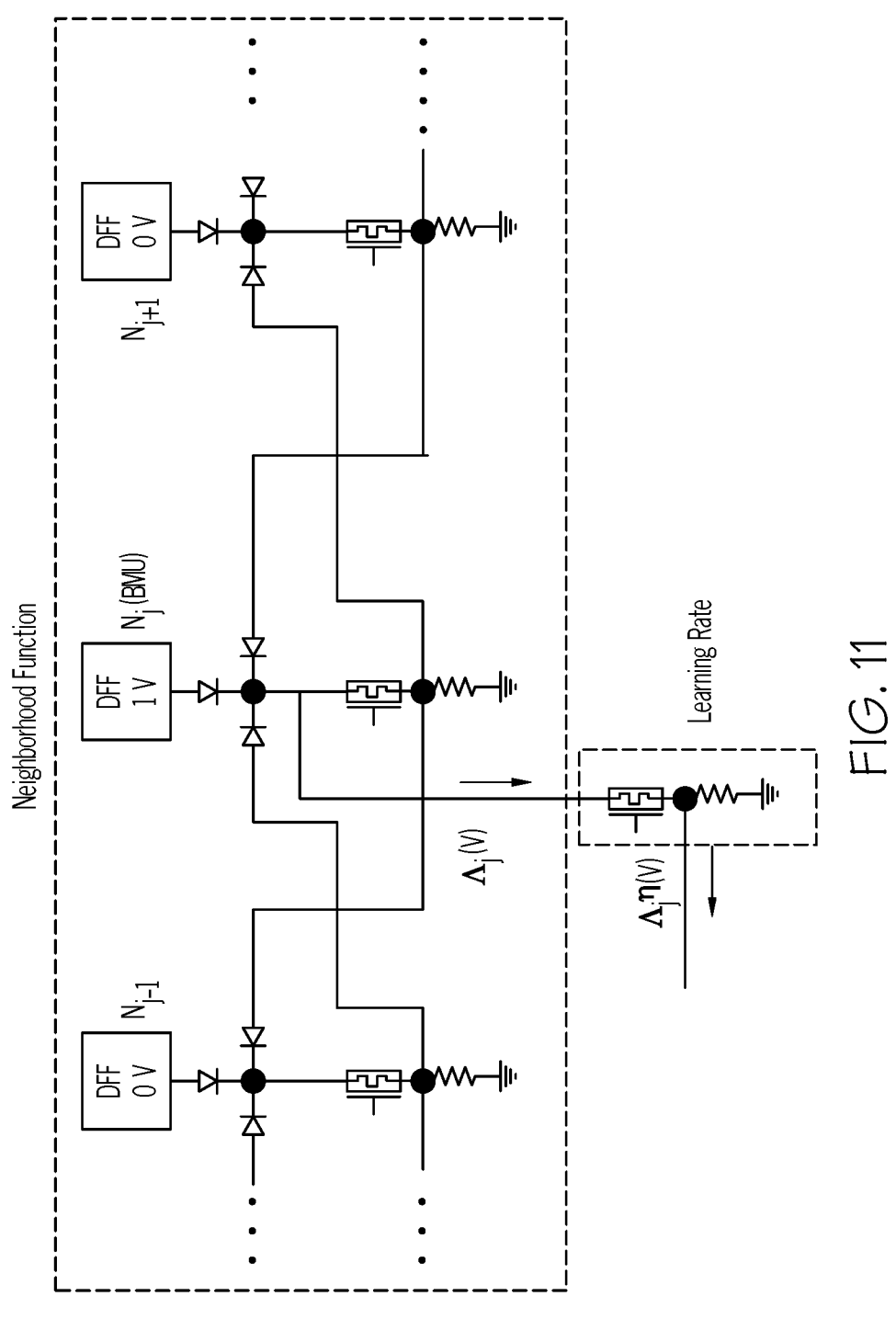
FIG. 11 schematically depicts an example reconfigurable interconnect in per neuron configuration, according to one or more embodiments shown and described herein.
Figure 12:
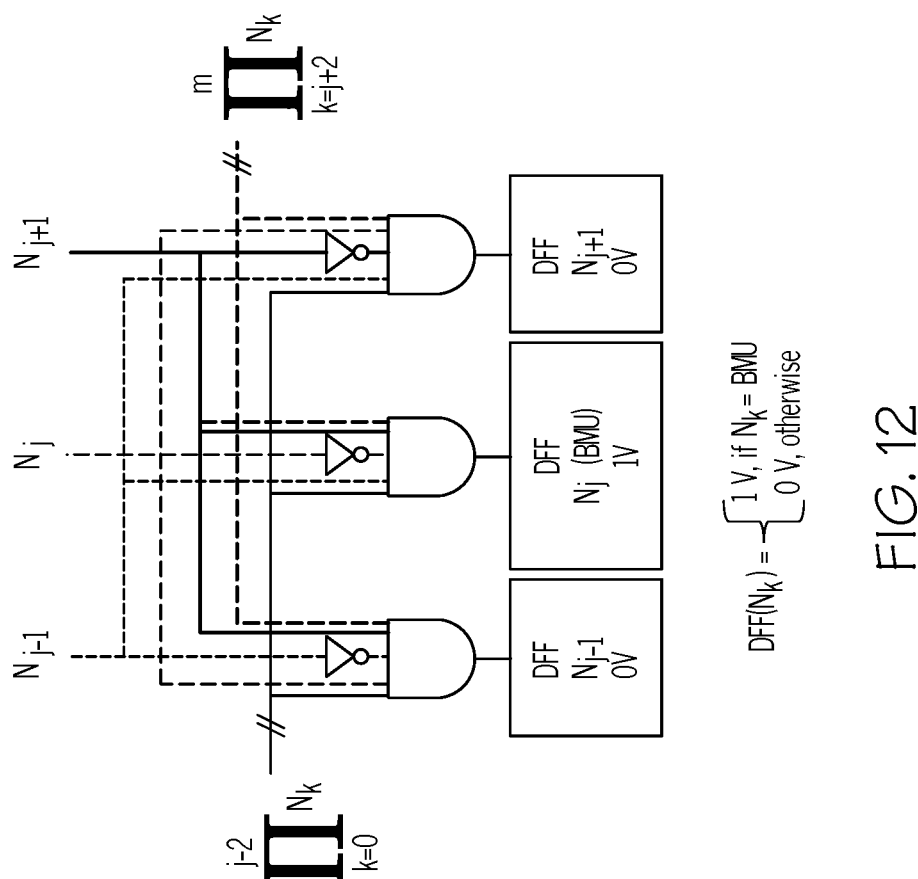
FIG. 12 depicts an example CVMOS exhaustive BMU selector circuit, according to one or more embodiments shown and described herein.

FIG. 5B shows another example SOFM architecture 502. The SOFM architecture 502 is simply to the SOFM architecture 500 of FIG. 5A, except that it includes RRAM Dendrite circuits 510, 512, 514 associated with each neuron of the SOFM 502. Examples of the RRAM Dendrite circuits 510, 512, 514 are shown in FIG. 11. Another example BMU selection circuit 422 is shown in FIG. 12.

Referring back to FIG. 4, the BMI neuron labeling circuit 424 is used to classify data after the SOFM 400 has been trained. In particular, the BMI neuron labeling circuit 424 determines a best matching input (BMI) for each neuron. The BMI of a neuron is a datapoint or input in a given dataset to which the neuro best matches or yields the smallest error. The BMI is, in one sense, the inverse of the BMU. Whereas the BMU is the neuron that best responds to a specific input, the BMI is the input that results in the best response of a specific neuron. Accordingly, by using a significantly smaller labeled dataset, an SOFM trained on a much larger set of unlabeled data can be labeled. Once labeled or trained, the SOFM can then be used to classify or inference on new data by using the label of the BMU for the given input as its class label.

Figure 6A:
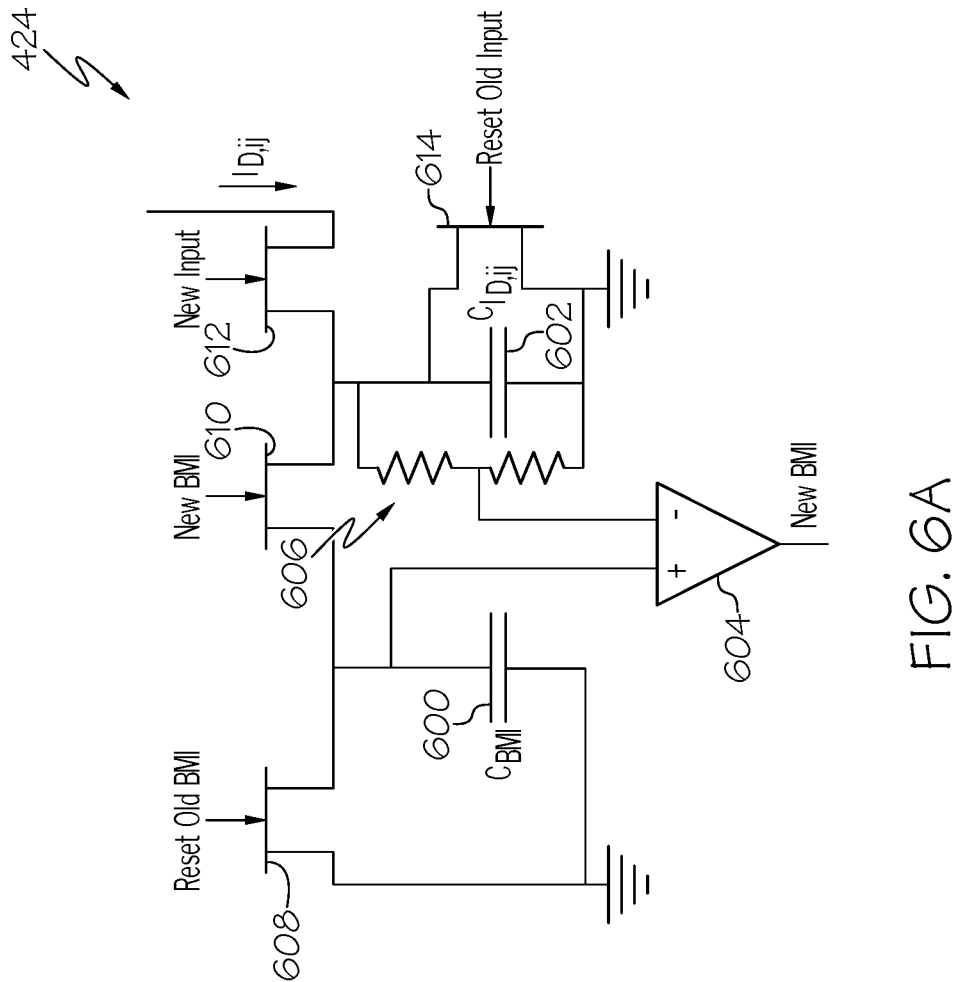
FIG. 6A depicts an example BMI neuron labeling circuit, according to one or more embodiments shown and described herein.

FIG. 6A shows an example architecture for the BMI neuron labeling circuit 424. The example BMI neuron labeling circuit 424 of FIG. 6A includes two capacitors, a BMI capacitor 600 and current input capacitor 602. The current input capacitor 602 is charged by the current input and the BMI capacitor 600 is charged from the error of the BMI thus far. A voltage comparator 604 determines if the error from the current input is lower than the BMI thus far. If so, the BMI capacitor 600 is reset and charged using the current input capacitor 602 storing the current input error. As such, the BMI of the neuro is updated to be the current observed input.

To account for charge sharing, the output of the current input capacitor 602 is scaled by a voltage divider circuit 606. Four transistors 608, 610, 612, and 614 are used to reset and charge the capacitors 600, 602, as shown in FIG. 6. The previous input stored in the current input capacitor 602 is discharged between each input by biasing the corresponding transistor 608. Once a new input is provided, the current input capacitor 602 is charged by biasing the transistor 612. If the voltage comparator 604 determines that a new BMI has been found (the voltage across the capacitor 600 is greater than the voltage across the capacitor 602), then the old BMI stored in the BMI capacitor 600 is discharged via the transistor 614. Finally, the new BMI is updated in the BMI capacitor 600 by the transistor 610.

Since the voltage across the capacitor 602 is proportional to the total drain current of the neuron or total Euclidean error, the BMI neuron labeling circuit 424 is able to notify when a new BMI has been found. This can be used to label each of the neurons by updating the neuron's label, upon every instance of a new BMI being detected, to the label of the new BMI. This allows for the entire SOFM to be labeled efficiently allowing for real-time dynamic labeling of the SOFM as the labeled dataset may change.

Figure 6B:
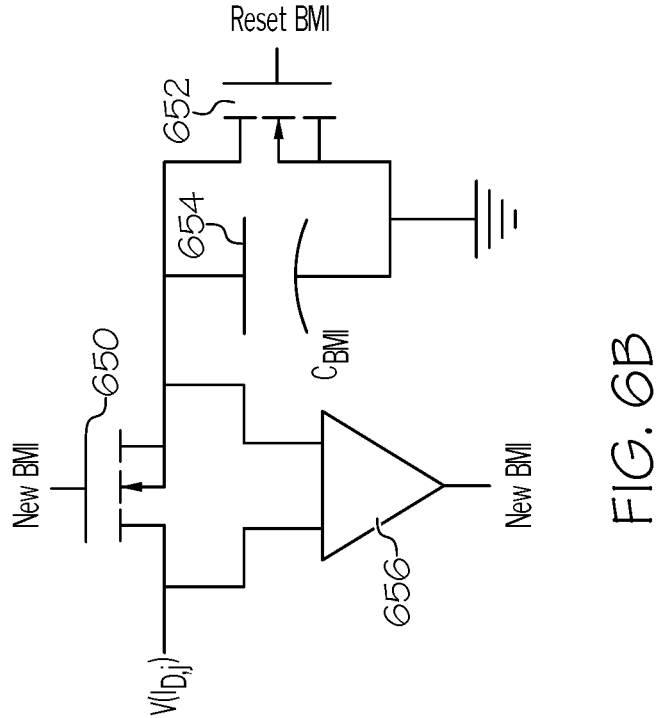
FIG. 6B depicts another example BMI neuron labeling circuit, according to one or more embodiments shown and described herein.

FIG. 6B shows another example architecture for the BMI neuron labeling circuit 424. In the example of FIG. 6B, the BMI neuron labeling circuit 424 only includes two transistors 650, 652, and one capacitor 654, along with a voltage comparator 656. In the example of FIG. 6B, the voltage capacitor 656 directly compares voltage rather than looking at previously stored voltages.

Figure 7:
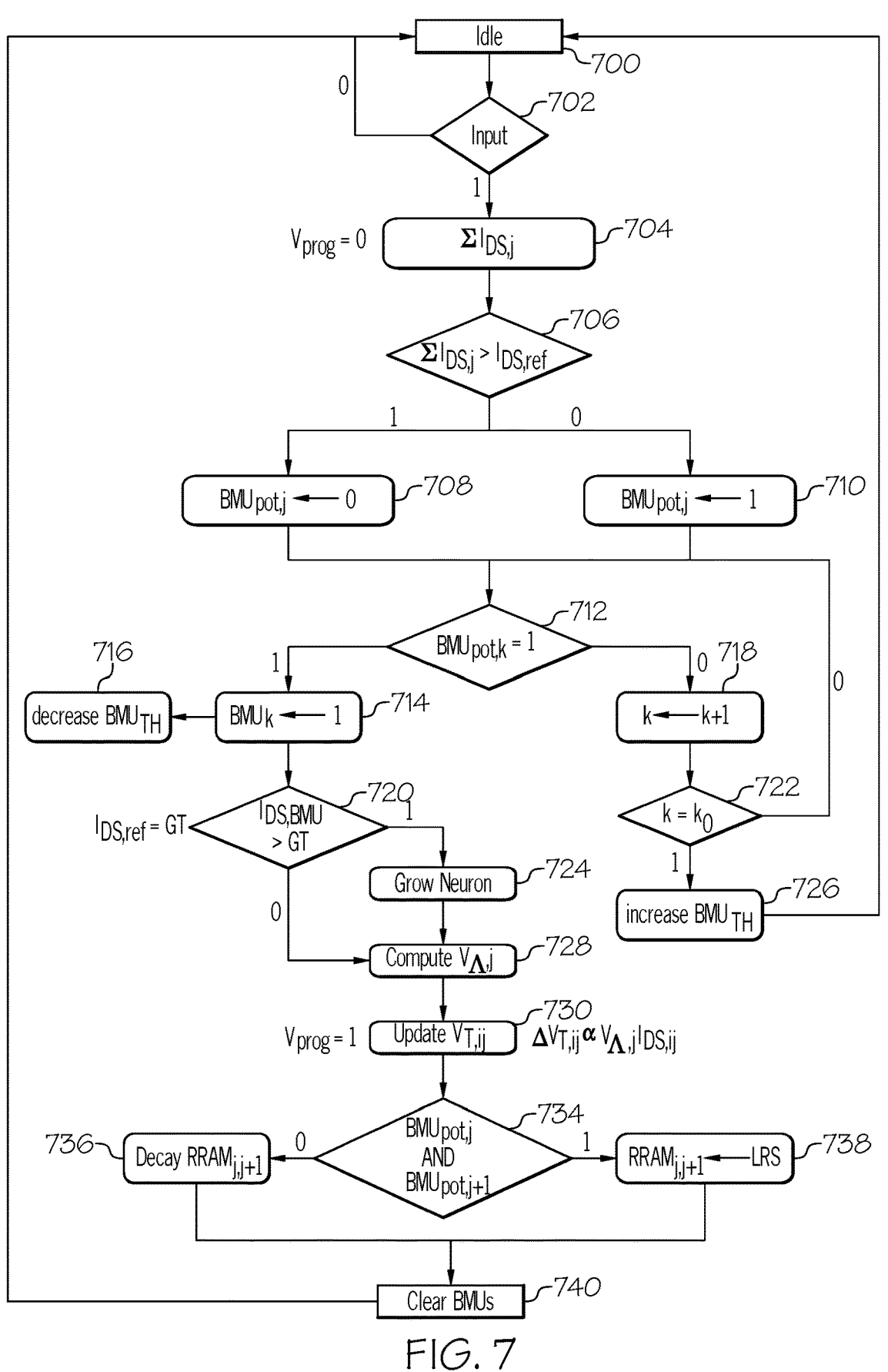
FIG. 7 depicts an example flowchart of a method for operating the SOFM of FIGS. 4, 5A, and 5B, according to one or more embodiments shown and described herein.

FIG. 7 depicts a flowchart of an example method of training the example SOFM 500 of FIG. A5. The synapses are initialized weigh random weights and the SOFM begin in idle at step 700. Then at step 702, an input is received. At step 704, the saturation drain currents $I_{DS,j}$ are summed to compute the Euclidean error.

At step 706, it is determined whether the summed saturation drain currents are greater than a reference current produced by the FeFETS 448, 450, 452 in the example of FIG. 5A. If the summed saturation drain currents are greater than the reference current, then at step 708, a potential BMU becomes 0, indicating a non-candidate BMU. If the summed saturation currents are less than the reference current, indicating too much error, then at step 710, the potential BMU becomes 1, indicating a non-candidate BMU.

At step 712, it is determined whether a potential BMU is 1 (indicating that a node is a candidate BMU). If the potential BMU is 0, then at step 718, the value of the counter 470 is increased by 1, at step 722, the value of k is compared to $k_0$. If the value of k is equal to the value of $k_0$, the initial value of k, then and at step 726, the BMU threshold is increased. Control may then return to step 700 so that another input can be received.

If, at step 712, the potential BMU is 1, then at step 714, the k-th neuron is selected as the BMU, and at step 716, the BMU threshold is decreased. At step 720, it is determined whether the saturation drain current of the BMU is greater than a growth threshold. If the saturation drain current of the BMU is greater than the growth threshold, then at step 724, a neuron is grown. If the saturation drain current of the BMU is not greater than the growth threshold, then control passes to step 728.

At step 728, the value of $V_{A,j}$ is computed by a reprogrammable interconnect such as 472, 474, 510, 512, 514, and at step 720, the value of $V_{T,ij}$ is updated. At step 734, it is determined whether the BMU potential of node j and the BMU potential of node j+1 is 1. If not, then at step 736, the RRAM is decayed. If so, the RRAM is set to LRS. Then, at step 740, the BMUs are cleared, and control returns to step 700 to receive the next input.

Figure 7B:
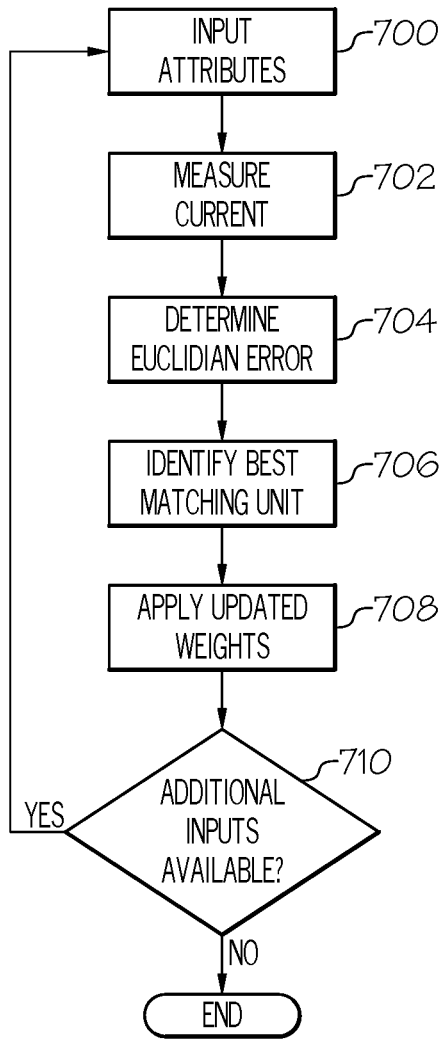
FIG. 7B depicts an example flowchart of another method for operating the SOFM of FIGS. 4, 5B, and 5B, according to one or more embodiments shown and described herein.

FIG. 7B is another example method of operating the SOFM 500 of FIG. 5A. At step 800, input attributes 420 are input to the SOFM 400. At step 802, a current sensor measures the saturation drain current of each synapse is measured. At step 804, the Euclidean error between the input attribute and the current weight of each synapse is determined based on the saturation drain current. As discussed above, the saturation drain current one FeFET of a synapse outputs the Euclidean error when the gate voltage is greater than or equal to the threshold voltage, and the saturation drain current of the other FeFET of the synapse outputs the Euclidean error when the gate voltage is less than the threshold voltage.

At step 806, a best matching unit is selected. In particular, the Euclidean errors are accumulated to compute a total error between the input and each synapse or neuron. The BMU selection circuit 422 then selects the synapse with the least total Euclidean error as the best matching unit, as discussed above. Then, at step 808, the weights of the neurons are updated by updating the threshold voltages of the FeFETs of the synapse. In particular, the weight of each neuron is updated based on how far it is from the best matching unit.

In the illustrated example, the weights are updated by applying programming pulses to the gate bias of the FeFETs of each synapse to modify their threshold voltages. In some examples, threshold voltage programming circuits 430, 432, 434, 436, 438, 440, 442, 444, and 446 apply the programming pulses to update the weights. When the synapses comprise two n-channel FeFETs, as in the example of FIG. 2, the threshold voltages of both FeFETs 202 and 204 must be updated. However, when the synapses comprise one n-channel FeFET and one p-channel FeFET, as in the example of FIG. 3, the threshold voltages of the FeFETs are moved together, which reduces the overhead of repeated Euclidean error computation.

At step 810, it is determined whether additional inputs are available. If additional inputs are available (Yes at step 710), then control returns to step 700 to apply the next set of input attributes. Alternatively, if additional inputs are not available (No at step 710), then the method of FIG. 7 ends. The trained SOFM can then be used to classify new data, as disclosed herein.

The disclosed SOFM algorithm was trained and tested on a COVID-19 chest x-ray set, comprising 148 images compressed to 100×100 pixels each. The COVID-19 chest x-ray dataset was split into a training dataset of 118 images and testing dataset of 30 images with samples from all classes present in both sets. The COVID-19 chest x-ray dataset consisted of two classes: healthy subjects (class 0) and the fraction of subjects after being diagnosed with COVID-19 (class 1).

After training the SOFM for 30 epochs, the training process was halted to evaluate the inferencing accuracy of the architecture on unobserved samples. The SOFM neurons were labeled according to the process described herein. Each neuron was labeled with the label of the best matching input in the labeled dataset. The labeled dataset was a fraction of the training dataset that retained its label or was labeled, while the remaining training dataset was unlabeled. The entirety of the testing dataset had to be labeled to evaluate the inferencing accuracy of the disclosed SOFM. The SOFM was evaluated using labeled datasets ranging from 1-5% of the trained dataset, and the labeled dataset had representation from each class.

Figure 8:
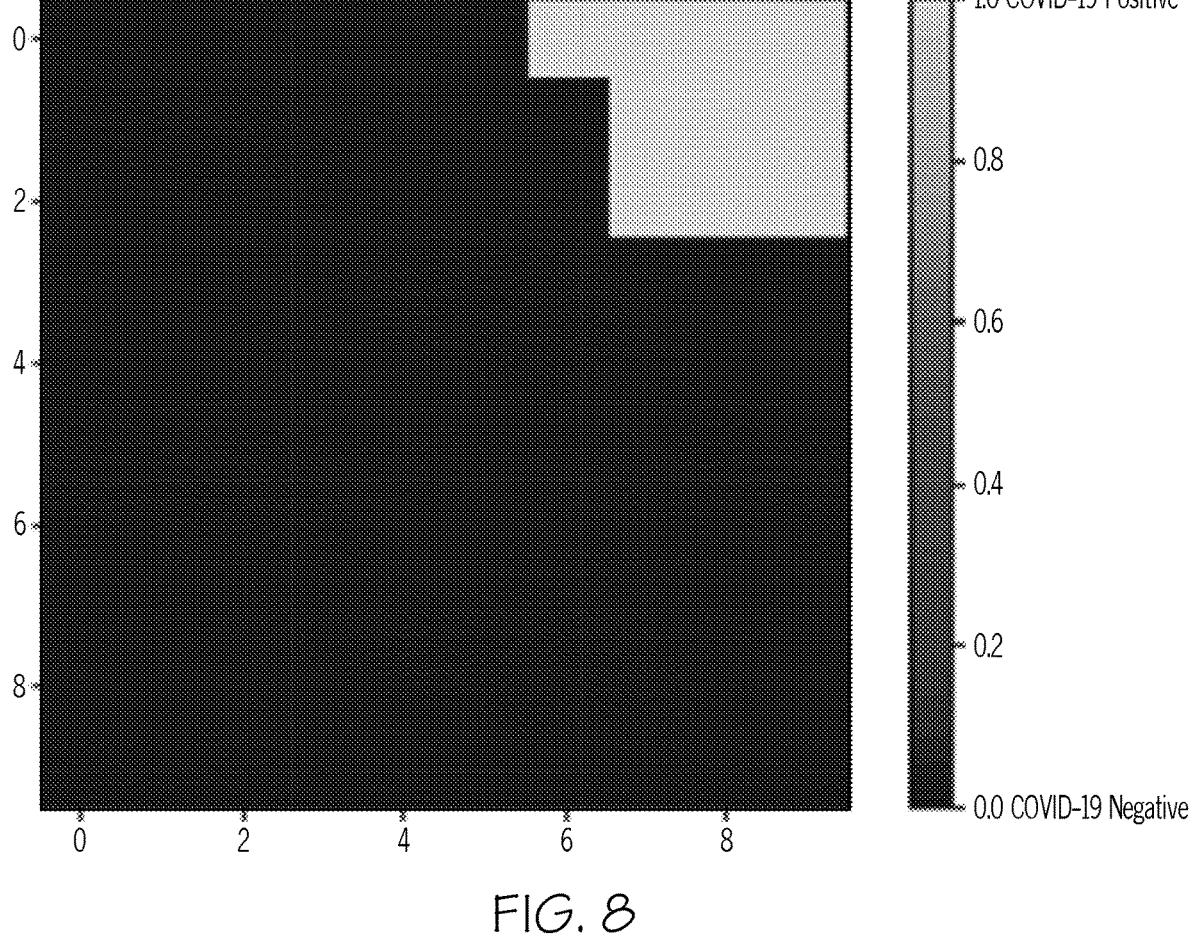
FIG. 8 depicts an example output map of the example SOFM trained on COVID-19 chest x-ray data.
Figure 9:
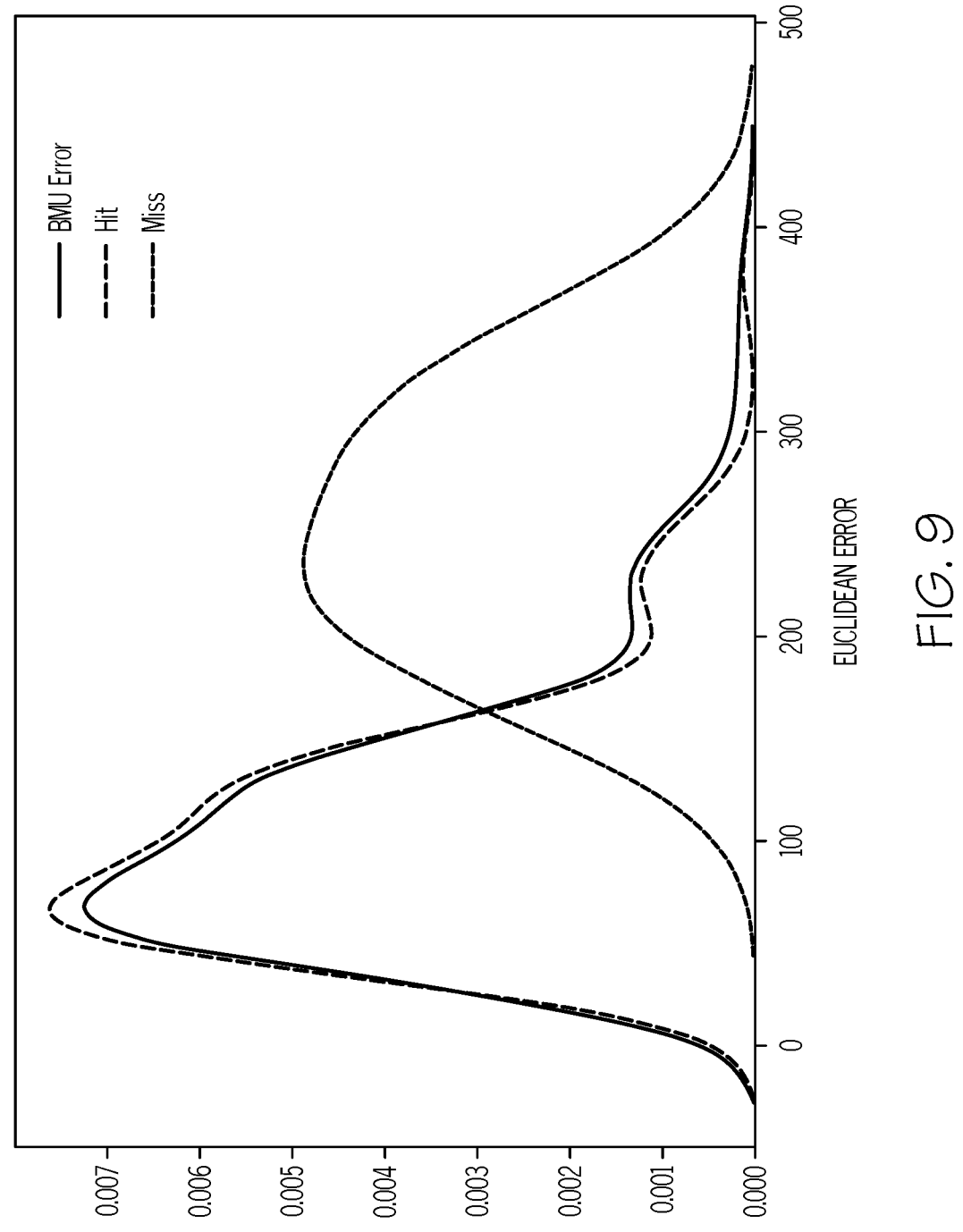
FIG. 9 depicts an example plot of kernel density estimation of BMU Euclidean error for all samples, hits, and misses of the example SOFM trained on the COVID-19 chest x-ray data.

The disclosed SOFM was able to successfully separate the clusters of healthy and COVID-19 diagnosed chest x-rays. The separation of clusters can be seen in FIG. 8. The disclosed SOFM is able to validate these clusters since it was able to achieve 96.62% accuracy with only 1% of the training dataset labeled. The architecture performed similarly when labeled using 2% and 54% of the dataset. This demonstrates that the disclosed SOFM algorithm is able to greatly reduce the size of the labeled data required to label the SOFM. Additionally, there is a distinct separation in the Euclidean errors of the BMU of the correctly (hits) and incorrectly (miss) classified samples, as can be seen in FIG. 9. This observation along with the high classification accuracy indicates that these higher error samples are outliers that can be classified as such and closely inspected by domain experts. Additionally, the separation in the BMU Euclidean errors of the hits and misses is retained.

It should now be understood that embodiments described herein are directed to a ferroelectric field effect transistors based approach for Euclidean distance calculation in neuromorphic hardware. By utilizing synapses comprising pairs of FeFETs as nodes of an SOFM network, the weights of the SOFM may be stored as threshold voltages of the FeFETs. Accordingly, no access to an external memory is required. Furthermore, the Euclidean error needed to train the SOFM can be obtained directly from the saturation drain current of the FeFETs. Therefore, the disclosed techniques can greatly simplify and accelerate training and use of SOFM networks compared to traditional computing methods.

The invention claimed is:

1. An apparatus comprising a synapse comprising:
a first reconfigurable field-effect transistor comprising an n-channel or p-channel ferroelectric field-effect transistor with a first gate voltage being an input voltage or a weight voltage and a first threshold voltage being based on the weight voltage or the input voltage; and
a second reconfigurable field-effect transistor connected in parallel to the first reconfigurable field-effect transistor and comprising an n-channel or p-channel ferroelectric field-effect transistor with a second gate voltage being the weight voltage or the input voltage and a second threshold voltage being based on the input voltage or the weight voltage, wherein
the input voltage is applied to a gate of at least one of the first reconfigurable field-effect transistor and the second reconfigurable field-effect transistor, the input voltage corresponding to an input attribute associated with an error computation; and
a current sensor measuring a saturation drain current of the first reconfigurable field-effect transistor or the second reconfigurable field-effect transistor, and determining a Euclidean error based on the saturation drain current of the first reconfigurable field-effect transistor or the second reconfigurable field-effect transistor.

2. The apparatus of claim 1, further comprising a threshold voltage programming circuit configured to update the first threshold voltage and/or the second threshold voltage.

3. The apparatus of claim 1, wherein:
the first reconfigurable field-effect transistor comprises an n-channel ferroelectric field-effect transistor with the first gate voltage being the input voltage and the first threshold voltage programmed to the weight voltage; and
the second reconfigurable field-effect transistor comprises an n-channel ferroelectric field-effect transistor with the second gate voltage being the weight voltage and the second threshold voltage programmed to the input voltage.

4. The apparatus of claim 1, wherein:
the first reconfigurable field-effect transistor comprises a p-channel ferroelectric field-effect transistor with the first gate voltage being the weight voltage and the first threshold voltage programmed to the input voltage minus a source voltage; and
the second reconfigurable field-effect transistor comprises a p-channel ferroelectric field-effect transistor with the second gate voltage being the input voltage and the second threshold voltage programmed to the weight voltage minus the source voltage.

5. The apparatus of claim 1, wherein:
the first reconfigurable field-effect transistor comprises an n-channel ferroelectric field-effect transistor with the first gate voltage being the input voltage and the first threshold voltage programmed to the weight voltage; and
the second reconfigurable field-effect transistor comprises a p-channel ferroelectric field-effect transistor with the second gate voltage being the input voltage and the second threshold voltage programmed to the first threshold voltage of the first reconfigurable field-effect transistor minus a supply voltage.

6. The apparatus of claim 1, wherein a plurality of synapses comprises a two-dimensional grid of the synapses configured to compute multiple Euclidean errors.

7. The apparatus of claim 1, wherein a plurality of synapses comprises a three-dimensional grid of the synapses configured to compute multiple Euclidean errors.

8. The apparatus of claim 1, further comprising:
a plurality of instances of the synapse arranged in a two-dimensional grid comprising a plurality of synapses, each synapse of the plurality of synapses corresponding to a neuron of a self-organizing feature map, wherein a weight associated with the neuron is stored such that a threshold voltage of at least one of the first reconfigurable field-effect transistor and the second reconfigurable field-effect transistor is based on the weight, and the input voltage applied to each synapse of the plurality of synapses corresponds to an input attribute of the self-organizing feature map;
a best matching unit selection circuit configured to determine a best matching neuron based on the saturation drain current of at least one of the first reconfigurable field-effect transistor and the second reconfigurable field-effect transistor of at least one synapse of the plurality of synapses; and
a threshold voltage programming circuit configured to update the threshold voltage of at least one of the first reconfigurable field-effect transistor and the second reconfigurable field-effect transistor of at least one synapse of the plurality of synapses based on the best matching neuron.

9. The apparatus of claim 8, wherein the saturation drain current of one of the reconfigurable field-effect transistors of each synapse corresponds to a Euclidean error between the input attribute and the weight associated with each neuron.

10. The apparatus of claim 8, wherein:
the first reconfigurable field-effect transistor comprises an n-channel ferroelectric field-effect transistor with the first gate voltage being the input voltage and the first threshold voltage programmed to the weight voltage, the weight voltage corresponding to the weight; and
the second reconfigurable field-effect transistor comprises an n-channel ferroelectric field-effect transistor with the second gate voltage being the weight voltage and the second threshold voltage programmed to the input voltage.

11. The apparatus of claim 8, wherein:
the first reconfigurable field-effect transistor comprises an n-channel ferroelectric field-effect transistor with the first gate voltage being the input voltage and the first threshold voltage programmed to the weight voltage, the weight voltage corresponding to the weight; and
the second reconfigurable field-effect transistor comprises a p-channel ferroelectric field-effect transistor with the second gate voltage being the input voltage and the second threshold voltage programmed to the first threshold voltage minus a supply voltage.

12. The apparatus of claim 8, wherein:
a current for each synapse is accumulated in a capacitor associated with the synapse; and
the best matching unit selection circuit comprises complementary metal-oxide semiconductor logic that identifies a neuron whose associated capacitor is last to charge to logic 1.

13. The apparatus of claim 8, further comprising a best matching input neuron labeling circuit configured to determine a best matching input for each neuron.

14. The apparatus of claim 13, wherein the best matching input neuron labeling circuit comprises:

a voltage comparator to determine if an error from a current input is lower than a current best matching input;

a capacitor charged from an error of the best matching input;

a third transistor configured to charge the capacitor; and a fourth transistor configured to discharge the capacitor.

15. The apparatus of claim 13, wherein the best matching input neuron labeling circuit further comprises:

a voltage comparator to determine if an error from a current input is lower than a current best matching input;

a first capacitor charged by the current input;

a second capacitor charged from an error of the best matching input;

a first transistor configured to discharge the first capacitor between each input;

a second transistor configured to charge the first capacitor when a new input is provided;

a third transistor configured to discharge a previous best matching input stored in the second capacitor when a new best matching input is found; and a fourth transistor configured to update the new best matching input on the second capacitor.

16. The apparatus of claim 8, wherein the saturation drain current of one of the reconfigurable field-effect transistors of each synapse corresponds to a value of the input attribute minus the weight associated with the neuron that corresponds to the synapse, all raised to a first power, wherein the first power has a value between 1 and 2 based on one or more parameters of the reconfigurable field-effect transistors.

17. The apparatus of claim 1, wherein the first reconfigurable field-effect transistor and the second reconfigurable field-effect transistor each comprises a ferroelectric field-effect transistor.

18. A method comprising:

receiving an input voltage corresponding to an input attribute of a self-organizing feature map;

applying the input voltage to each synapse of a two-dimensional grid of synapses, each synapse corresponding to a neuron of the self-organizing feature map, and comprising two reconfigurable field-effect transistors, wherein a weight associated with the neuron is stored such that a threshold voltage of at least one of the reconfigurable field-effect transistors is based on the weight;

determining a best matching neuron based on a saturation drain current of at least one of the reconfigurable field-effect transistors of each synapse; and updating the threshold voltage of at least one of the reconfigurable field-effect transistors of at least one synapse of the two-dimensional grid of synapses based on the best matching neuron.

19. The method of claim 18, wherein:

a first reconfigurable field-effect transistor of the two reconfigurable field-effect transistors comprises an n-channel ferroelectric field-effect transistor with a first gate voltage being the input voltage and a first threshold voltage programmed to a weight voltage; and a second reconfigurable field-effect transistor of the two reconfigurable field-effect transistors comprises an n-channel ferroelectric field-effect transistor with a second gate voltage being the weight voltage and a second threshold voltage programmed to the input voltage.

20. The method of claim 18, wherein:

a first reconfigurable field-effect transistor of the two reconfigurable field-effect transistors comprises an n-channel ferroelectric field-effect transistor with a first gate voltage being the input voltage and a first threshold voltage programmed to a weight voltage; and a second reconfigurable field-effect transistor of the two reconfigurable field-effect transistors comprises a p-channel ferroelectric field-effect transistor with a second gate voltage being the input voltage and a second threshold voltage programmed to the first threshold voltage minus a supply voltage.

* * * * *